US008670235B2

(12) United States Patent
Watts et al.

(10) Patent No.: US 8,670,235 B2
(45) Date of Patent: Mar. 11, 2014

(54) REMOVAL OF VAPOR AND ULTRAFINE PARTICLES FROM PRINTING DEVICE

(75) Inventors: Christopher F. D. Watts, Hertfordshire (GB); Paul Wissgott, Hertfordshire (GB)

(73) Assignee: Xerox Corporation, Norwalk, CT (US)

( * ) Notice: Subject to any disclaimer, the term of this patent is extended or adjusted under 35 U.S.C. 154(b) by 399 days.

(21) Appl. No.: 13/046,809

(22) Filed: Mar. 14, 2011

(65) Prior Publication Data

US 2012/0236497 A1 Sep. 20, 2012

(51) Int. Cl.
*H05K 7/20* (2006.01)

(52) U.S. Cl.
USPC ............................ 361/695; 361/696; 361/697

(58) Field of Classification Search
USPC ............................ 399/98; 361/695, 696, 697
See application file for complete search history.

(56) References Cited

U.S. PATENT DOCUMENTS 3,967,549 A 7/1976 Thompson et al.
6,032,004 A 2/2000 Mirabella, Jr. et al.
6,643,220 B2 11/2003 Anderson et al.
7,040,388 B1 5/2006 Sato et al.
7,055,931 B2 6/2006 West et al.
2002/0114136 A1* 8/2002 Cardenas ...................... 361/709
2005/0238810 A1* 10/2005 Scaringe et al. ........... 427/249.1
2008/0181688 A1* 7/2008 Kurita ........................... 399/341
2011/0142483 A1* 6/2011 Oomoto et al. ................. 399/93
2011/0211859 A1* 9/2011 Shimoyama et al. ........... 399/93

FOREIGN PATENT DOCUMENTS

GB 351458 6/1931
JP H08-166722 A * 6/1996 ............ G03G 15/10

* cited by examiner

*Primary Examiner* — Clayton E Laballe
*Assistant Examiner* — Jas Sanghera
(74) *Attorney, Agent, or Firm* — Gibb & Riley, LLC

(57) ABSTRACT

A printing apparatus comprises a paper path adjacent a media supply. The paper path moves printing media from the media supply through the printing apparatus. Also, a marking engine is positioned adjacent the paper path, and the paper path supplies the printing media to said marking engine. The marking engine prints marking material on the printing media in a printing process, and the printing process generates vapors and ultrafine particles. The printing apparatus includes ducting adjacent the paper path and the marking engine. A fan is positioned within the ducting. The fan moves the vapors and ultrafine particles from around the paper path and the marking engine into the ducting. Further, at least one condensation unit is located within the ducting. The condensation unit is maintained at a temperature sufficient to condense and collect the vapors and ultrafine particles. The condensation unit comprises a base and poles extending from the base, the poles (which can comprise rods, pins, carbon nanotubes, etc.) are sized to maximize condensation and collection of the vapors and ultrafine particles.

20 Claims, 6 Drawing Sheets

REMOVAL OF VAPOR AND ULTRAFINE PARTICLES FROM PRINTING DEVICE

BACKGROUND

Embodiments herein generally relate to printers and printing devices, and more particularly to printing devices that include condensation units that have features sized to condense and collect vapors and ultrafine particles before they have a chance to exit the printing device.

Many demands are made of modern printing devices, including emission limitation requirements. For example, the RAL (German institute for Quality Assurance and Labeling) may introduce an Ultrafine Particle limit for photocopier machines when the current RAL UZ122 specification expires on 31st Dec. 2011. This may impact all office products in development that carry or wish to carry the Blue Angel label. If devices are not able to demonstrate compliance to the new requirement, such devices may not be able to compete effectively in the lucrative bids and tenders market in Western Europe. For example, the RAL could set a nominal target of <50,000 particle counts in a print cycle or a similarly low emission rate target. Therefore, controlling emissions from printing devices is a concern.

SUMMARY

An exemplary printing apparatus herein comprises a paper path adjacent a media supply. The paper path moves printing media through the printing apparatus. Also, a marking engine is positioned adjacent the paper path, and the paper path supplies the printing media to said marking engine. The marking engine prints marking material on the printing media in a printing process, and the printing process generates vapors and ultrafine particles.

As would be understood by those ordinarily skilled in the art, the marking engine has heating elements that generate the vapors and ultrafine particles when the heating element contacts the printing media. The vapors and ultrafine particles comprise at least one of water vapor, volatile organic compounds, particulates, etc. The ultrafine particles generally have a size less than 100 nanometers.

Therefore, the printing apparatus includes ducting adjacent the paper path and the marking engine. A fan is positioned within the ducting. The fan moves the vapors and ultrafine particles from around the paper path and the marking engine into the ducting. Further, at least one condensation unit is located within the ducting. The condensation unit is maintained cooler than the area around the marking engine. More specifically, the condensation unit is maintained at a temperature sufficient to condense the vapors to liquid form and collect the vapors and ultrafine particles in liquid form (maintained at a temperature lower than the vapors and ultrafine particles). In some embodiments, powered cooling elements (refrigeration units) can be thermally connected to the condensation units to cool the condensation unit below ambient temperature to further promote condensation of the vapors and ultrafine particles.

The condensation unit has a base and poles extending from the base, the poles (which can comprise rods, pins, carbon nanotubes, etc.) are sized and arranged to maximize condensation and collection of the vapors and ultrafine particles. Alternatively, a thermally conductive mesh material can be used in place of the poles. The mesh material has openings that are also sized to maximize condensation and collection of the vapors and ultrafine particles.

These and other features are described in, or are apparent from, the following detailed description.

BRIEF DESCRIPTION OF THE DRAWINGS

Various exemplary embodiments of the systems and methods are described in detail below, with reference to the attached drawing figures, in which.

DETAILED DESCRIPTION

As mentioned above, controlling emissions from printing devices is a concern. A substantial portion of ultrafine particles emitted from a printing machine is water vapor released when fuser heat is applied to the paper. The ultrafine particles can also include volatile organic compounds from materials such as the fuser web oil. These ultrafine particles typically exist in a gas or liquid (vapor) phase and are transported out of the machine in cooling airstreams.

Therefore, the embodiments herein use condensation of vapors to coalescence ultrafine particles on cooled surfaces and collect such coalesced ultrafine particles within a collection reservoir in the machine to reduce that amount of ultrafine particle emissions that exit the machine and enter the atmosphere.

Condensation within a printing machine may be undesirable, because it can sometimes lead to electrical faults or paper feed issues. This is at odds with the desire to limit the vapor emissions, that are characterized as ultrafine particles; however, the embodiments herein include ducting surfaces that increase the amount of condensation and control the coalescence and drainage flow to avoid the risk of malfunction and improve machine operation and reliability.

Figure 1:
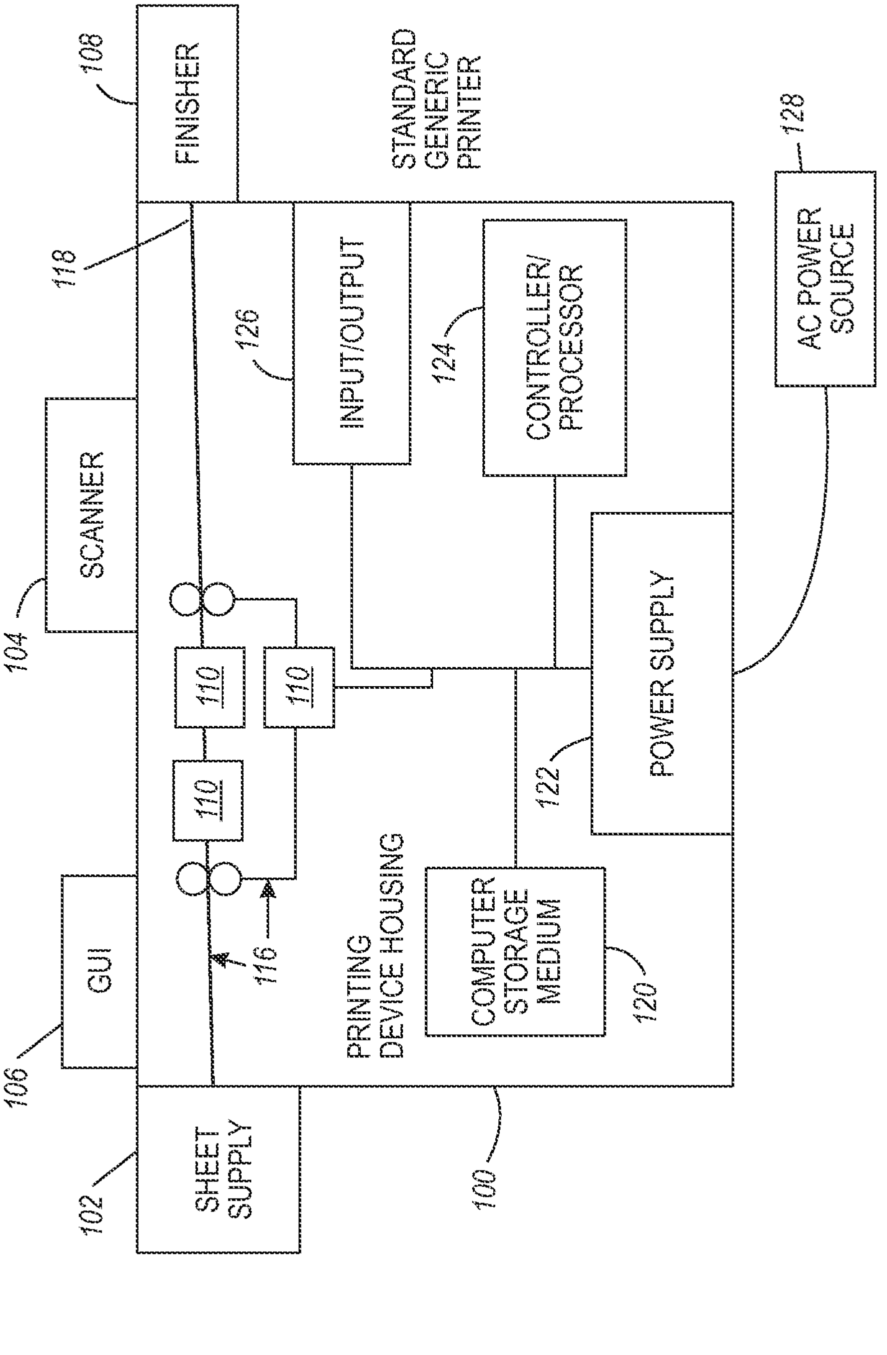
FIG. 1 is a side-view schematic diagram of a printing device according to embodiments herein.

FIG. 1 illustrates a computerized printing device 100, which can be used with embodiments herein and can comprise, for example, a printer, copier, multi-function machine, etc. The printing device 100 includes a controller/processor 124, at least one marking device (printing engines) 110 operatively connected to the processor 124, a media path 116 positioned to supply sheets of media from a sheet supply 102 to the marking device(s) 110, and a communications port (input/output) 126 operatively connected to the processor 124 and to a computerized network external to the printing device. After receiving various markings from the printing engine(s), the sheets of media can optionally pass to a finisher 108 which can fold, staple, sort, etc., the various printed sheets.

Also, the printing device 100 can include at least one accessory functional component (such as a scanner/document handler 104, sheet supply 102, finisher 108, etc.) and graphic user interface assembly 106 that also operate on the power supplied from the external power source 128 (through the power supply 122).

The input/output device 126 is used for communications to and from the multi-function printing device 100. The processor 124 controls the various actions of the printing device. A non-transitory computer storage medium device 120 (which can be optical, magnetic, capacitor based, etc.) is readable by the processor 124 and stores instructions that the processor 124 executes to allow the multi-function printing device to perform its various functions, such as those described herein.

Thus, a printer body housing 100 has one or more functional components that operate on power supplied from the alternating current (AC) 128 by the power supply 122. The power supply 122 connects to an external alternating current power source 128 and converts the external power into the type of power needed by the various components.

As would be understood by those ordinarily skilled in the art, the printing device 100 shown in FIG. 1 is only one example and the embodiments herein are equally applicable to other types of printing devices that may include fewer components or more components. For example, while a limited number of printing engines and paper paths are illustrated in FIG. 1, those ordinarily skilled in the art would understand that many more paper paths and additional printing engines could be included within any printing device used with embodiments herein.

Figure 2:
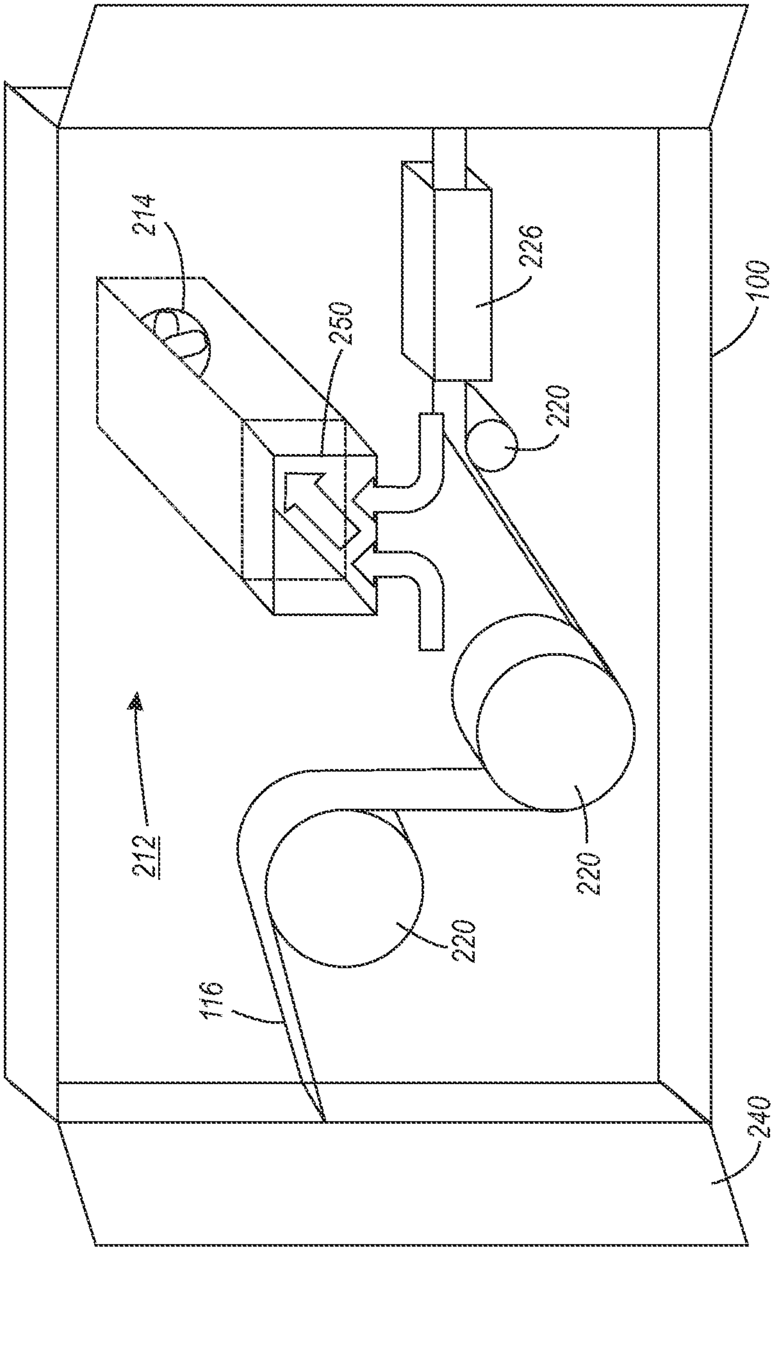
FIG. 2 is a perspective-view schematic diagram of a portion of a printing device according to embodiments herein.

FIG. 2 is a perspective view of a portion of the printing device 100 illustrated in FIG. 1 that might be seen when some of the doors of the printing device are open. Items 220 illustrates various rollers (transfer rollers, fusing rollers, etc.) that might be positioned along the media path 116 and item 226 represents any other commonly found processing element. As would be understood by those ordinarily skilled in the art, the marking engine 110 has heating elements 220, 226 that generate the vapors and ultrafine particles when the heating element contacts the printing media. The vapors and ultrafine particles comprise water vapor, volatile organic compounds, particulates, etc. The ultrafine particles generally have a size less than 100 nanometers.

Figure 3:
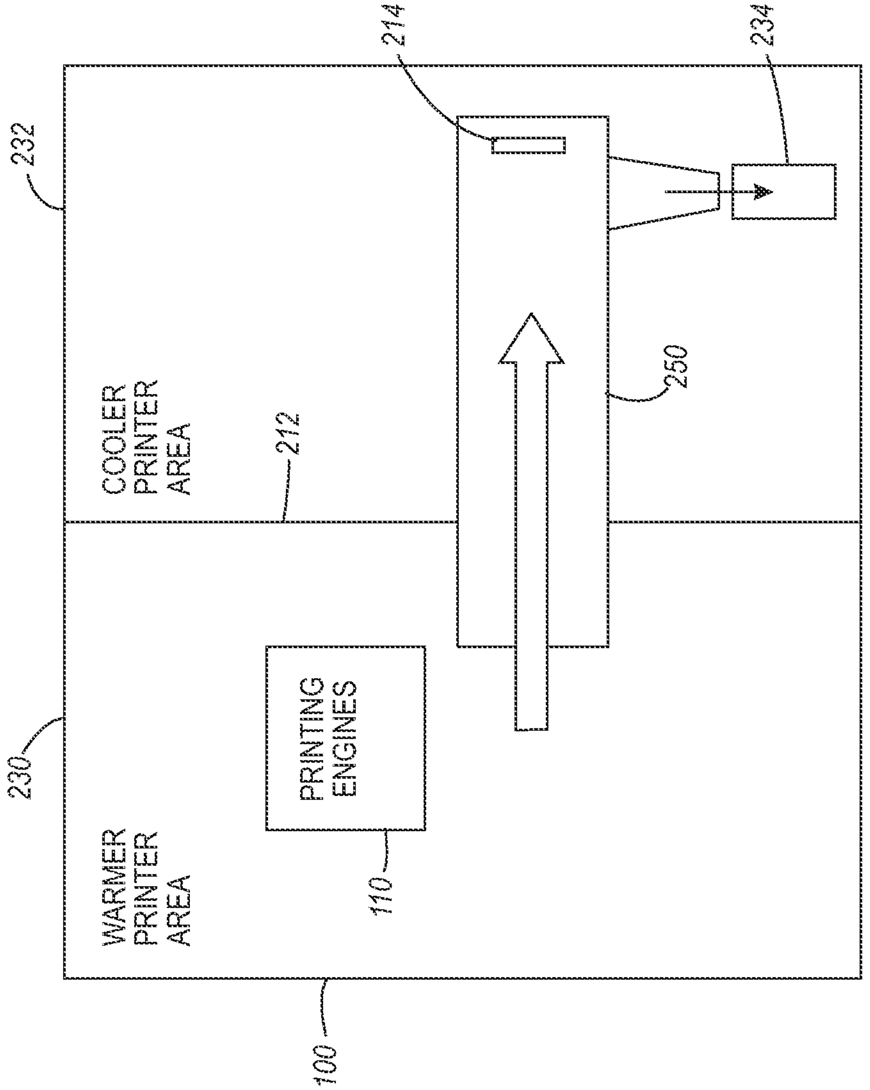
FIG. 3 is a end-view schematic diagram of a portion of a printing device according to embodiments herein.

Additionally, FIG. 3 illustrates the same portion of the printing structure 100 from a cross-section end view. Certain internal portions of the printing device 100 will be warmer than other internal portions. Therefore, portions containing the printing engines 110, labeled as item 230, represents the warmer printing areas, while the cooler printing areas are represented by item 232.

Any of the items 110, 220, 226 may produce ultrafine particle emissions. Therefore, the embodiments herein include ducting 250 and a fan 214 positioned in or near the ducting 250. As shown, the ducting 250 is adjacent the paper path 116 and the marking engine 110. The fan 214 draws air (including vapor, ultra fine particles, other foreign matter, etc.) into the ducting 250.

Further, in the view shown in FIG. 3, the fan 214 within the ducting 250 draws air from the warmer printer area 230 to the cooler printer area 232 (across boundary 212, which may be an insulated wall within the printing device 100). At least one condensation unit 252 is located within the ducting 250. As shown, the condensation unit 252 can be maintained in a location of the printer that is cooler than the area around the marking engine 110.

More specifically, the condensation unit 252 is maintained at a temperature sufficient to condense the vapors to liquid form and collect the vapors and ultrafine particles in liquid form (maintained at a temperature lower than the vapors and ultrafine particles). In one example, fuser exit air, typically at 25° C. and 90% humidity (or higher) condenses on surfaces at approximately 23° C. As would be understood by those ordinarily skilled in the art, the embodiments herein work upon the principle of dew point and, so long as the condensation units 252 are maintained at a temperature below the dew point of the vapors, the vapors will condense.

Once the vapors condense, they are collected into a container 234 that can be removed from the printing device 100 so that the ultra fine particles can be disposed of properly. The container 234 can either be a dedicated bottle or can be a multi-use container, such as a waste toner bottle (here, the mixing of toner and water reduces the likelihood of toner clouding when the waste toner bottle is replaced).

Figure 4:
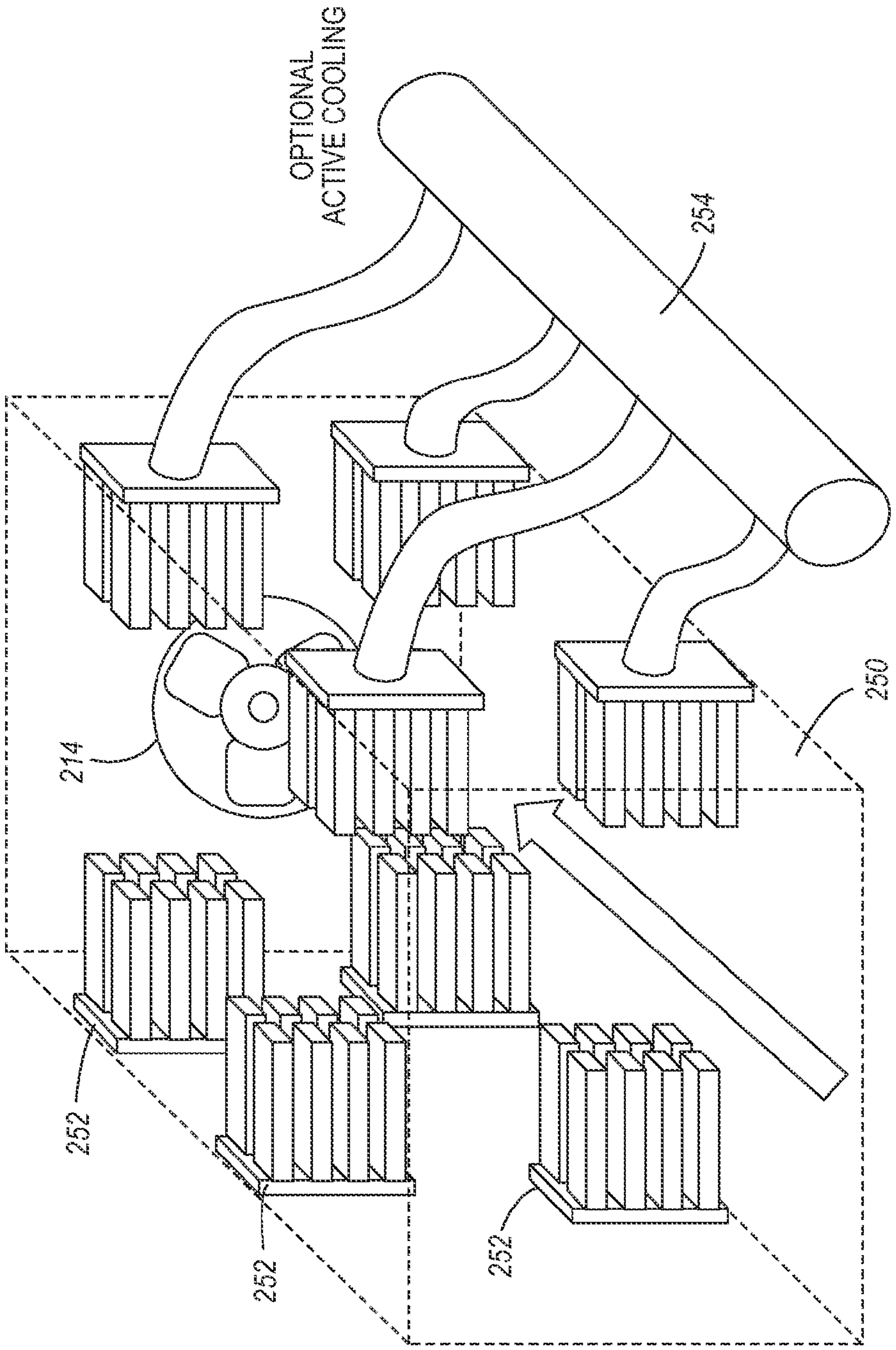
FIG. 4 is a perspective-view schematic diagram of ductwork of a printing device according to embodiments herein.

FIG. 4 illustrates a transparent view of the ducting 250 which shows the condensation units 252 in greater detail. As shown in FIG. 4, the condensation units 252 can be maintained at the required lower temperature (below the dew point of the air within the ducting 250) simply by being positioned within the cooler printer area 232. Alternatively, powered cooling elements 254 (refrigeration units) can be thermally connected to the condensation units 252 to cool the condensation unit 252 below ambient temperature to further promote condensation of the vapors and ultrafine particles and allowing the condensation units 252 to be placed anywhere in the ducting 250.

Figure 5:
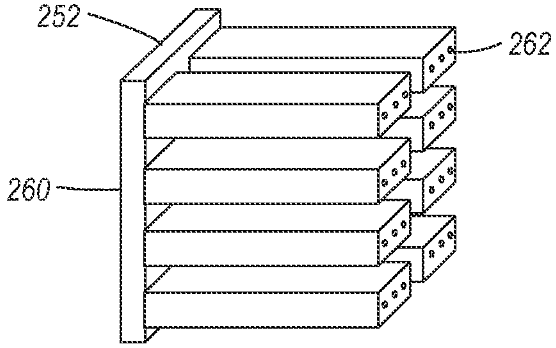
FIG. 5 is a perspective-view schematic diagram of a condensation unit of a printing device according to embodiments herein.
Figure 6:
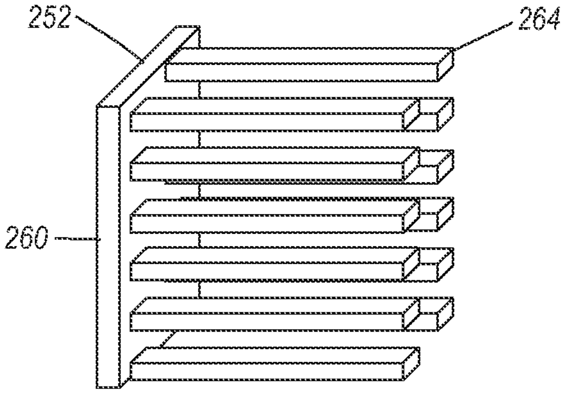
FIG. 6 is a perspective-view schematic diagram of a condensation unit of a printing device according to embodiments herein.
Figure 7:
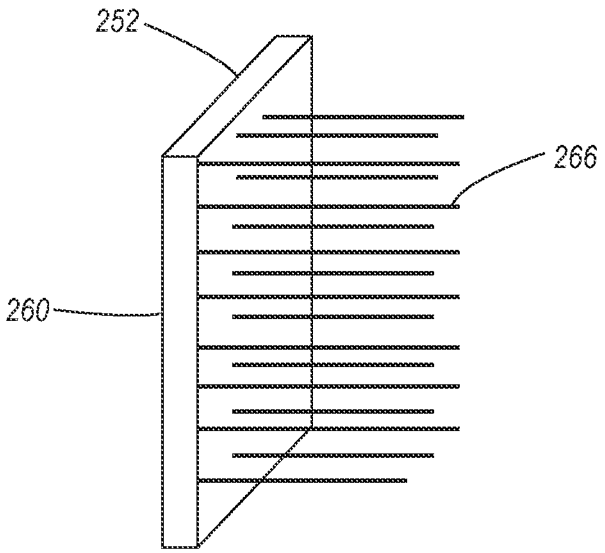
FIG. 7 is a perspective-view schematic diagram of a condensation unit of a printing device according to embodiments herein.
Figure 8:
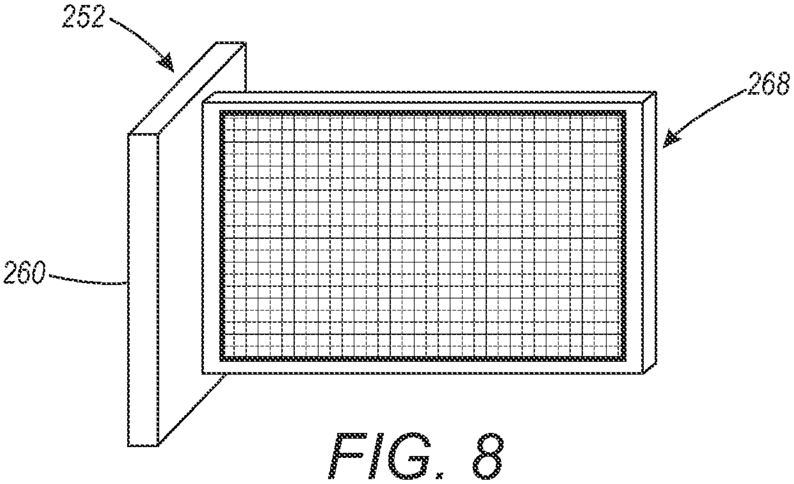
FIG. 8 is a perspective-view schematic diagram of a condensation unit of a printing device according to embodiments herein.

FIGS. 5-8 illustrate different examples of the condensation units that can be utilized by embodiments herein. Each of the condensation units 252 has a base 260. FIGS. 5-7 illustrate poles extending from the base 260. The poles can comprise rods 262 (FIG. 5) pins 264 (FIG. 6), carbon nanotubes 266 (FIG. 7), etc. Alternatively, a thermally conductive mesh material 268 (FIG. 8) can be used in place of the poles. While FIGS. 5-8 illustrate some examples of the condensation units 252, those ordinarily skilled in the art will understand that the condensation units 252 could take many different forms and that the limited number of condensation units shown in the drawings and discussed herein are merely examples and the claims below are intended to include all potential forms of such condensation units (which will vary from application to application).

While some existing systems use condensation surfaces to remove vapors from internal regions of printing devices (see, for example, U.S. Pat. No. 6,643,220) such conventional systems do not effectively remove ultrafine particles because such conventional systems do not contain surfaces that are arranged, sized, and shaped to attract ultra fine particles. To the contrary, with the embodiments herein, the poles are arranged, sized, and shaped to maximize condensation and collection of the vapors and ultrafine particles. The poles provide a significantly higher surface area of cooling, over that of a flat surface. The smaller the diameter and closer together the poles are increases the surface area available for cooling. Significantly, as shown in FIG. 6, the pins 264 are in the bulk air stream and can be positioned and orientated to 'cover' the duct 250, such that there is not a direct path through the ducting 250, aiding particulate capture (there being at least one potential non-linear path through the pins 264).

Similarly, the mesh material 268 can have openings (which can be nanosized openings) that are also sized to maximize condensation and collection of the vapors and ultrafine particles. The mesh material 268 can incorporate fine strands or fibres, assuming that these have heat transfer properties, i.e., conduct heat efficiently (metal), then the mesh 268 ensures that the entire duct cross section is covered. As ultra fine particulate move due to Brownian motion (randomly) as well as with the airflow, it is not always necessarily to have very small air gaps, and apertures of 0.1 um would work efficiently.

Many computerized devices are discussed above. Computerized devices that include chip-based central processing units (CPU's), input/output devices (including graphic user interfaces (GUI), memories, comparators, processors, etc. are well-known and readily available devices produced by manufacturers such as Dell Computers, Round Rock Tex., USA and Apple Computer Co., Cupertino Calif., USA. Such computerized devices commonly include input/output devices, power supplies, processors, electronic storage memories, wiring, etc., the details of which are omitted herefrom to allow the reader to focus on the salient aspects of the embodiments described herein. Similarly, scanners and other similar peripheral equipment are available from Xerox Corporation, Norwalk, Conn., USA and the details of such devices are not discussed herein for purposes of brevity and reader focus.

The terms printer or printing device as used herein encompasses any apparatus, such as a digital copier, bookmaking machine, facsimile machine, multi-function machine, etc., which performs a print outputting function for any purpose. The details of printers, printing engines, etc., are well-known by those ordinarily skilled in the art and are discussed in, for example, U.S. Pat. No. 6,032,004, the complete disclosure of which is fully incorporated herein by reference. The embodiments herein can encompass embodiments that print in color, monochrome, or handle color or monochrome image data. All foregoing embodiments are specifically applicable to electrostatographic and/or xerographic machines and/or processes.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements). Further, the terms automated or automatically mean that once a process is started (by a machine or a user), one or more machines perform the process without further input from any user.

It will be appreciated that the above-disclosed and other features and functions, or alternatives thereof, may be desirably combined into many other different systems or applications. Various presently unforeseen or unanticipated alternatives, modifications, variations, or improvements therein may be subsequently made by those skilled in the art which are also intended to be encompassed by the following claims. The claims can encompass embodiments in hardware, software, and/or a combination thereof. Unless specifically defined in a specific claim itself, steps or components of the embodiments herein cannot be implied or imported from any above example as limitations to any particular order, number, position, size, shape, angle, color, or material.

What is claimed is:

1. A printing apparatus comprising:

a media supply;

a paper path adjacent said media supply, said paper path moving printing media from said media supply through said printing apparatus;

a marking engine adjacent said paper path, said paper path supplying said printing media to said marking engine, said marking engine printing marking material on said printing media in a printing process, said printing process generating vapors and ultrafine particles;

ducting adjacent said paper path and said marking engine;

a fan within said ducting, said fan moving said vapors and ultrafine particles from around said paper path and said marking engine into said ducting; and at least one condensation unit within said ducting, said condensation unit being maintained at a temperature sufficient to condense and collect said vapors and ultrafine particles, said condensation unit comprising a base and poles extending from said base, said poles being sized to maximize condensation and collection of said vapors and ultrafine particles.

2. The printing apparatus according to claim 1, said marking engine comprising a heating element that generates said vapors and ultrafine particles when said heating element contacts said printing media.

3. The printing apparatus according to claim 1, said vapors and ultrafine particles comprising at least one of water vapor, volatile organic compounds, and particulates.

4. The printing apparatus according to claim 1, said condensation unit being at a lower temperature than said vapors and ultrafine particles.

5. The printing apparatus according to claim 1, said ultrafine particles having a size less than 100 nanometers.

6. A printing apparatus comprising:

a media supply;

a paper path adjacent said media supply, said paper path moving printing media from said media supply through said printing apparatus;

a marking engine adjacent said paper path, said paper path supplying said printing media to said marking engine, said marking engine printing marking material on said printing media in a printing process, said printing process generating vapors and ultrafine particles;

ducting adjacent said paper path and said marking engine;

a fan within said ducting, said fan moving said vapors and ultrafine particles from around said paper path and said marking engine into said ducting; and at least one condensation unit within said ducting, said condensation unit being maintained at a temperature sufficient to condense and collect said vapors and ultrafine particles, said condensation unit comprising a base and a mesh material extending from said base, openings in said mesh material being sized to maximize condensation and collection of said vapors and ultrafine particles.

7. The printing apparatus according to claim 6, said marking engine comprising a heating element that generates said vapors and ultrafine particles when said heating element contacts said printing media.

8. The printing apparatus according to claim 6, said vapors and ultrafine particles comprising at least one of water vapor, volatile organic compounds, and particulates.

9. The printing apparatus according to claim 6, said condensation unit being at a lower temperature than said vapors and ultrafine particles.

10. The printing apparatus according to claim 6, said ultrafine particles having a size less than 100 nanometers.

11. A printing apparatus comprising:

a media supply;

a paper path adjacent said media supply, said paper path moving printing media from said media supply through said printing apparatus;

a marking engine adjacent said paper path, said paper path supplying said printing media to said marking engine, said marking engine printing marking material on said printing media in a printing process, said printing process generating vapors and ultrafine particles;

ducting adjacent said paper path and said marking engine;

a fan within said ducting, said fan moving said vapors and ultrafine particles from around said paper path and said marking engine into said ducting;

at least one condensation unit within said ducting, said condensation unit being maintained at a temperature sufficient to condense and collect said vapors and ultrafine particles, said condensation unit comprising a base and poles extending from said base, said poles being sized to maximize condensation and collection of said vapors and ultrafine particles; and powered cooling elements thermally connected to said condensation units.

12. The printing apparatus according to claim 11, said marking engine comprising a heating element that generates said vapors and ultrafine particles when said heating element contacts said printing media.

13. The printing apparatus according to claim 11, said vapors and ultrafine particles comprising at least one of water vapor, volatile organic compounds, and particulates.

14. The printing apparatus according to claim 11, said condensation unit being at a lower temperature than said vapors and ultrafine particles.

15. The printing apparatus according to claim 11, said ultrafine particles having a size less than 100 nanometers.

16. A printing apparatus comprising:

a media supply;

a paper path adjacent said media supply, said paper path moving printing media from said media supply through said printing apparatus;

a marking engine adjacent said paper path, said paper path supplying said printing media to said marking engine, said marking engine printing marking material on said printing media in a printing process, said printing process generating vapors and ultrafine particles;

ducting adjacent said paper path and said marking engine;

a fan within said ducting, said fan moving said vapors and ultrafine particles from around said paper path and said marking engine into said ducting; and at least one condensation unit within said ducting, said condensation unit being maintained at a temperature sufficient to condense and collect said vapors and ultrafine particles, said condensation unit comprising a base and poles comprising carbon nanotubes extending from said base, said carbon nanotubes being sized to maximize condensation and collection of said vapors and ultrafine particles.

17. The printing apparatus according to claim 16, said marking engine comprising a heating element that generates said vapors and ultrafine particles when said heating element contacts said printing media.

18. The printing apparatus according to claim 16, said vapors and ultrafine particles comprising at least one of water vapor, volatile organic compounds, and particulates.

19. The printing apparatus according to claim 16, said condensation unit being at a lower temperature than said vapors and ultrafine particles.

20. The printing apparatus according to claim 16, said ultrafine particles having a size less than 100 nanometers.

* * * * *